March 21, 1961 R. E. SCHOCK 2,976,410

AUTOMATIC FREQUENCY CONTROL SYSTEM

Filed Jan. 29, 1957

INVENTOR.
ROBERT E. SCHOCK
BY
Charles H. Brown
ATTORNEY 2,976,410
Patented Mar. 21, 1961

2,976,410

AUTOMATIC FREQUENCY CONTROL SYSTEM

Robert E. Schock, Riverhead, N.Y., assignor to Radio Corporation of America, a corporation of Delaware Filed Jan. 29, 1957, Ser. No. 636,980
9 Claims. (Cl. 250—20)

Figure 1:
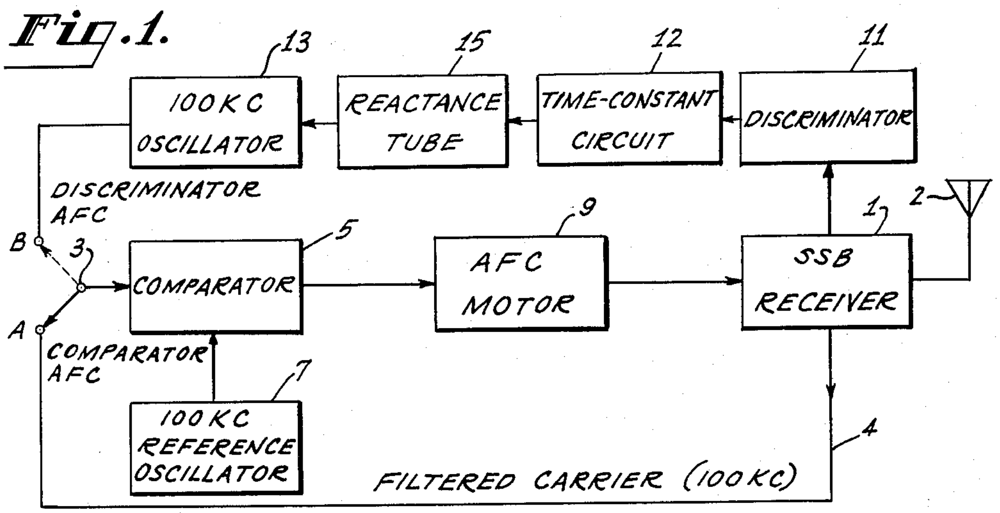

This invention relates to an automatic frequency control system for use in conjunction with a single-sideband receiver, and more particularly to a system which will provide automatic frequency control for all types of telegraph signals, including telegraph signals transmitted without a carrier frequency.

An object of the invention is to enable, in a novel manner, automatic tuning of a single sideband receiver which receives telegraph signals not accompanied by a carrier frequency.

Another object of the invention is to provide an automatic frequency control system which permits the use of a comparator type frequency control circuit separately or in combination with a discriminator type frequency control circuit.

A further object of the invention is to provide an automatic frequency control system of the comparator type which can be used with a discriminator type of automatic frequency control circuit in association with a single-sideband receiver when the received signals do not contain a carrier frequency.

Briefly stated, the invention comprises in combination, a comparator type automatic frequency control circuit and a discriminator type frequency control circuit, the comparator circuit operating on a signal produced by the discriminator type automatic frequency control circuit when the signal received by a single-sideband receiver does not contain a carrier frequency. In a single-sideband system wherein the transmitted intelligence contains a telegraph signal composed of mark and space frequencies and a carrier frequency, the carrier frequency is filtered out of the received signal by the single-sideband receiver and is fed into a comparator where it is compared in frequency and phase to a reference oscillator of carrier frequency. Deviations in phase or frequency of the received carrier from the reference oscillator frequency result in voltage changes in the output of the comparator which actuate an automatic frequency control motor to tune the single-sideband receiver to the frequency of the received signal. If a telegraph signal is received which contains mark and space frequencies but does not contain a carrier frequency, the comparator automatic frequency control circuit would not ordinarily be effective to tune the receiver. In accordance with the present invention, there is provided a discriminator type frequency control circuit which can be used in combination with the comparator system to provide automatic frequency control of the receiver. The discriminator type frequency control circuit contains a discriminator whose center frequency is set equal to either the mark or the space frequency of the telegraph signal. Assuming the discriminator is arranged so that its center frequency is equal to the mark frequency of the received signal and the mark frequency drifts, due to some frequency instability at the transmitter or the receiver, the resulting voltage generated by the discriminator will bias a reactance tube to change the frequency of an oscillator contained in the discriminator frequency control circuit so it no longer agrees in frequency with the reference oscillator. The outputs of the discriminator circuit oscillator and the reference oscillator are both fed into the comparator which operates an automatic frequency control motor to retune the single-sideband receiver to the point where the mark frequency of the telegraph signal is in the center of the discriminator characteristic and the frequency of the discriminator circuit oscillator agrees with the frequency of the reference oscillator.

The discriminator, the reactance tube and the discriminator oscillator taken together may be considered as an adaptor to enable the conventional comparator type of automatic frequency control circuit to be used with a discriminator type of automatic frequency control circuit when the signals received by the single-sideband receiver do not contain a carrier frequency.

The same principles of operation outlined above apply when the discriminator is arranged so that its center frequency is equal to the space frequency of the received signal, and the space frequency drifts.

Figure 2:
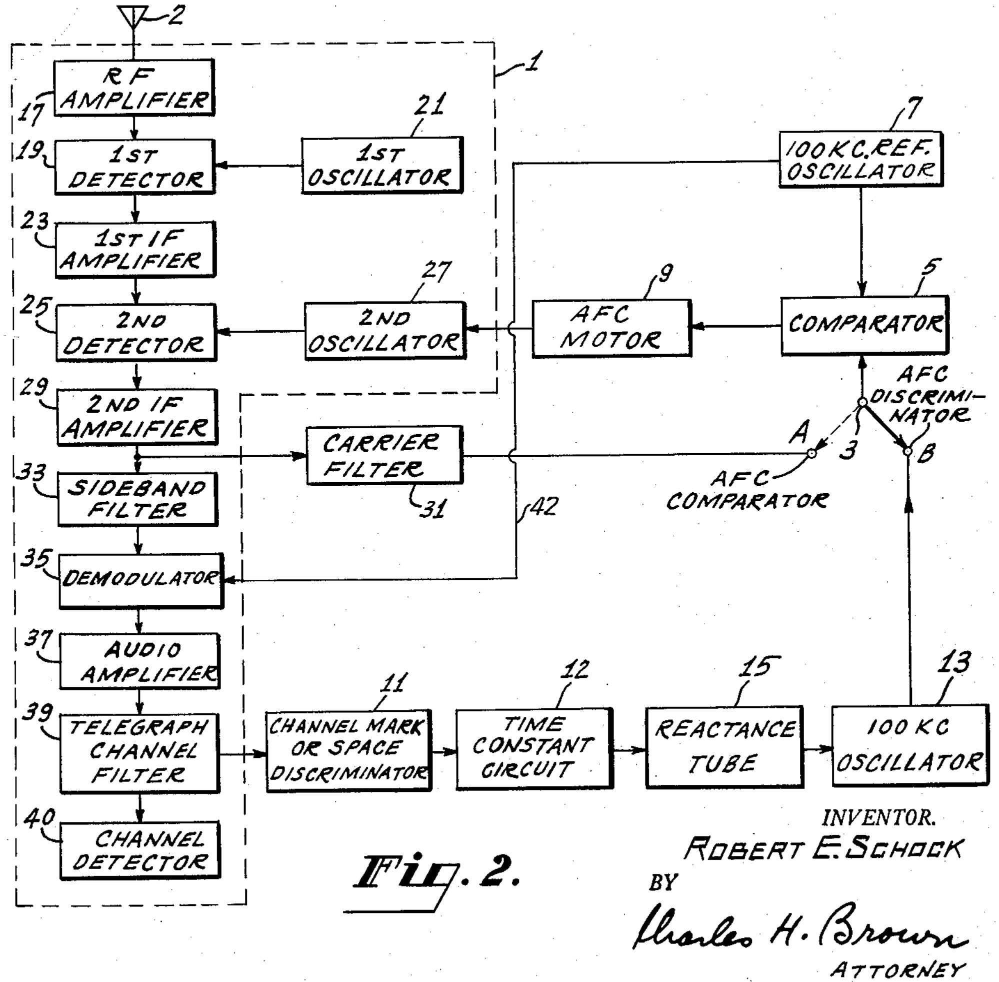

In describing the invention in more detail reference is made to the following drawings wherein:

Fig. 1 is a diagrammatical presentation, in box form, of a preferred embodiment of the invention illustrating the interconnection of the comparator type automatic frequency control circuit with the discriminator adaptor automatic frequency control circuit; and Fig. 2 is a more detailed diagrammatical presentation, in box form, of the automatic frequency control system showing the interconnection of the frequency control components with the various stages of a single sideband receiver.

Referring to Fig. 1 in detail, there is shown a single-sideband radio receiver 1 to which is fed a radio signal received over an antenna 2. The receiver feeds a filtered carrier signal over lead 4 thru the first position A of a switch 3 to a frequency comparator 5. The comparator 5 compares the frequency of the filtered carrier signal with the frequency of a stable reference oscillator 7. Oscillator 7 may be a crystal controlled oscillator generating a frequency of 100 kilocycles (kc.), for example. When the frequency of the carrier signal differs from the frequency of the reference oscillator 7, the comparator 5 actuates an automatic frequency control motor 9 in a corrective sense for tuning the single-sideband receiver 1 to the frequency of the received signal. When a telegraph signal which does not contain a carrier frequency is received by the single-sideband receiver, the comparator 5 is ineffective to control the motor 9. In order to provide automatic frequency control for the single-sideband receiver under this condition, a discriminator adaptor is connected to the single-sideband receiver by throwing the switch 3 to position B. The discriminator adaptor includes a discriminator 11 serially connected to an oscillator 13 thru a time constant circuit 12 and reactance tube 15. The discriminator adaptor is connected thru the second position B of switch 3 and thence to the comparator 5 when the arm of switch 3 is thrown to position B. The discriminator 11 is designed to operate on a center frequency equal to either the mark or space frequency of a telegraph signal. In the preferred embodiment of the invention, the center frequency of the discriminator is made equal to the mark frequency of a telegraph signal and this frequency, by way of example, may be 765 cycles. When the mark frequency of the signal received by the single-sideband receiver drifts due to frequency instability at the transmitter or the receiver, a voltage is generated by discriminator 11 to bias reactance tube 15 and change the frequency output of oscillator 13 in an amount and direction as a function of the magnitude and polarity of the output voltage from the discriminator 11. The changed frequency of oscillator 13 is compared with the stable reference frequency of oscillator 7 in the comparator 5. The time constant circuit 12 holds the discriminator output constant during the intervals between mark signals.

The difference in frequency of oscillator 13 and oscillator 7 generates a voltage which actuates the automatic frequency control motor 9 to tune the single-sideband receiver 1 to the frequency of the mark signal.

Fig. 2 illustrates in greater detail the interconnection of the comparator frequency control circuit and the discriminator type frequency control circuit with the various stages of the single-sideband receiver in the system of Fig. 1. The same reference characters are used in Figs. 1 and 2 to designate the same circuit elements. The single-sideband receiver 1 is fed by antenna 2 and includes a radio frequency amplifier 17 feeding a (radio frequency) signal into a first detector 19. A first oscillator 21 feeds a signal into the first detector 19 to heterodyne with the received radio frequency signal and produce a first intermediate frequency. The first detector 19 feeds the intermediate frequency signal to a first intermediate frequency amplifier 23. The amplified intermediate frequency signal is then fed into a second detector 25. The heterodyne action of the second detector 25 is controlled in frequency by a second oscillator 27. The second and lower intermediate frequency output of the second detector is fed to a second intermediate frequency amplifier 29. The amplified second intermediate frequency is then fed both to a carrier filter 31 and a sideband filter 33. The carrier frequency of the telegraph signal is filtered out of the intermediate frequency by the carrier filter 31. The carrier is fed thru the first position A of switch 3 to the frequency comparator 5, where the frequency of the carrier is compared to the frequency of the stable reference oscillator 7. The standard frequency of the stable reference oscillator may be 100 kilocycles (kc.) but this frequency is not critical and may be varied to agree with the international standard carrier frequencies in use.

Any deviation of the carrier frequency from the standard frequency of the reference oscillator is detected by the comparator 5 and results in a generated voltage which actuates the automatic frequency control motor 9 in a corrective sense to tune the second oscillator 27 to the proper frequency for reception of the carrier.

The mark and space frequencies of the telegraph signal are fed from the sideband filter 33 to a demodulator 35 which converts the second intermediate frequency of the signal to an audio frequency. The demodulator 35 includes a source of signal energy at the carrier frequency or 100 kc. in the example given. The second intermediate frequency signal is demodulated against the carrier frequency signal to produce the audio frequency signal or original mark and space frequencies. In practice, the output of the reference oscillator 7 may be fed as the carrier frequency signal to the demodulator 35 over a lead 42. In cases where the carrier is present in the incoming signal, the output of the carrier filter 31 may be fed to the demodulator 35. The audio frequency signal produced by the demodulator 35 is then amplified in an audio amplifier 37 and fed to a telegraph channel filter 39.

From the telegraph channel filter 39 the mark and space frequencies of the telegraph signal are fed both to a channel detector 40 and a channel mark or space frequency discriminator 11. The channel detector 40 is the output stage of the receiver 1 and may be of the type to which the outputs of other, similar receivers are fed as in a diversity receiving system. The detector 40 selects the most satisfactory of the incoming signals applied thereto, and forwards that signal to the desired utilization circuit or equipment. Discriminator 11 is connected thru time constant circuit 12 to reactance tube 15. The channel mark or space frequency discriminator 11 is designed to operate on a center frequency equal to either the mark frequency or the space frequency of the telegraph signal. It is assumed, for example, that the center frequency of the discriminator equals the mark frequency. Any deviation of the received mark frequency from standard mark frequency due to the drift of the telegraph transmitter or receiver is detected in the frequency discriminator 11 and results in a change of output voltage which is applied to the reactance tube 15. Time constant circuit 12 holds the output of discriminator 11 constant during the intervals between mark signals. The change of bias on the reactance tube 15 changes the frequency of oscillator 13. The standard frequency of oscillator 13 is labeled as 100 kc., but it may be varied to agree with the standard carrier frequencies in use.

When a telegraph signal is received which does not contain a carrier frequency the comparator 5 would ordinarily be ineffective. In order to supply automatic frequency control for the single-sideband receiver it is necessary to supply a comparison signal to the comparator 5. In effect, the output signal of the oscillator 13 takes the place of the carrier frequency ordinarily accompanying a telegraph signal. Thus, by placing the switch 3 in the second position B, the output signal of oscillator 13 is fed to the comparator 5 for comparison in frequency and phase with the frequency of the stable reference oscillator 7 and the receiver is provided with a discriminator type automatic frequency control system based on the mark or space frequency of the telegraph signal.

The automatic frequency control system of the invention thus provides for the proper reception of telegraph signals both with and without a carrier frequency.

What is claimed is:

1. An automatic frequency control system comprising a comparator frequency control circuit having an output coupled to a tuning element in a receiver and including a stable reference oscillator, a reactance control, a frequency discriminator circuit connected to said receiver and to said reactance control and arranged to apply a control signal to said reactance control according to energy received by said discriminator circuit from said receiver, a second oscillator connected to said reactance control and arranged to operate at a frequency determined by the operation of said reactance control in response to said control signal, a switch having first and second positions, the first position of said switch coupling the input of said comparator circuit to a portion of said receiver to compare the carrier frequency of a received signal with said first oscillator frequency, said comparator circuit being arranged when said switch is in said first position to produce an output signal determined according to the difference between said carrier frequency and said first oscillator frequency, the second position of said switch connecting the output of said second oscillator to said input of said comparator circuit to compare said first oscillator frequency and said second oscillator frequency, said comparator circuit being arranged when in said second position to produce said output signal determined according to the difference between said first oscillator frequency and said second oscillator frequency.

2. An automatic frequency control system as claimed in claim 1 and wherein said receiver is adapted to receive a telegraph signal having a mark frequency and a different space frequency, said discriminator circuit being arranged to operate at a center frequency equal to one of said mark and space frequencies.

3. An automatic frequency control system adapted to be used in a single-sideband receiver responsive to a received signal comprising a comparator frequency control circuit having an output coupled to a tuning element in a receiver and including a stable reference oscillator, a reactance control, a frequency discriminator circuit connected to said receiver and to said reactance control and arranged to apply a control signal to said reactance control according to energy received by said discriminator circuit from said receiver, a second oscillator connected to said reactance control and arranged to operate at a frequency determined by the operation of said reactance control in response to said control signal, a manually operated switch having first and second positions, the first position of said switch coupling the input of said comparator circuit through a carrier filter to the output of the last intermediate frequency stage of said receiver to compare the carrier frequency of said received signal with said first oscillator frequency, said comparator circuit being arranged when said switch is in said first position to produce an output signal determined according to the difference between said carrier frequency and said first oscillator frequency, the second position of said switch connecting the output of said second oscillator to said input of said comparator circuit to compare said first oscillator frequency and said second oscillator frequency when said received signal is without a carrier frequency, said comparator circuit being arranged when in said second position to produce said output signal determined according to the difference between said first oscillator frequency and said second oscillator frequency.

4. An automatic frequency control system as claimed in claim 3 and wherein said receiver is adapted to receive a telegraph signal having a mark frequency and a different space frequency, said discriminator circuit being arranged to operate at a center frequency equal to one of said mark and space frequencies.

5. An automatic frequency control system for controlling the tuning of a receiver comprising, in combination, a comparator circuit, a stable oscillator arranged to supply a signal of given frequency to said comparator circuit, a control circuit coupled to receive energy from said receiver and including a signal generating means for normally producing an output signal of given frequency, said control circuit being arranged to vary the frequency of said output signal from said generating means according to the deviation in frequency of said energy from a given frequency, a switching means having first and second conditions, the switching means when in said first condition coupling an input of said comparator circuit to a portion of said receiver to compare the carrier frequency of a received signal and the frequency of said signal supplied by said oscillator, said comparator circuit producing an output signal according to the differences between said carrier frequency and said oscillator frequency, means connected between said comparator circuit and a tuning element in said receiver to operate said tuning element according to the output signal from said comparator, the switching means when in said second condition coupling the output of said control circuit to said input of said comparator to compare said oscillator frequency and the frequency of the output signal produced by said control circuit, said comparator circuit being operated when said switching means is in said second condition to produce an output signal for application to said tuning element according to the differences between said oscillator frequency and the frequency of the output signal produced by said control circuit.

6. An automatic frequency control system for controlling the tuning of a single sideband receiver comprising, in combination, a comparator circuit, a stable oscillator arranged to supply a signal of given frequency to said comparator circuit, a control circuit including a discriminator circuit coupled to receive energy from said receiver and also including a signal generating means for normally producing an output signal of said given frequency, said control circuit being arranged to vary the frequency of said output signal from said given frequency according to the output of said discriminator circuit, a switching means having first and second conditions, the switching means when in said first condition coupling an input of said comparator circuit to a portion of said receiver to compare the carrier frequency of a received signal and the frequency of said signal supplied by said oscillator, said comparator circuit producing an output signal according to the difference between said carrier frequency and said oscillator frequency, means connected between said comparator circuit and a tuning element in said receiver to operate said tuning element according to the output signal from said comparator, the switching means when in said second condition coupling the output of said control circuit to said input of said comparator to compare said oscillator frequency and the frequency of the output signal produced by said control circuit determined by said energy received by said discriminator circuit from said receiver, said comparator circuit being operated when said switching means is in said second condition to produce an output signal for application to said tuning element according to the difference between said oscillator frequency and the frequency of the output signal produced by said control circuit.

7. An automatic frequency control system as claimed in claim 6 and wherein said means to operate said tuning element includes an automatic frequency control motor coupled to the output of said comparator circuit and responsive to said output signal to be actuated in a corrective sense.

8. A system for controlling the tuning of a receiver comprising, in combination, a comparator circuit, a stable oscillator arranged to supply a signal of a first frequency to said comparator circuit, a control circuit coupled to receive energy from said receiver, a second oscillator normally producing an output signal of said first frequency, said control circuit being coupled to said second oscillator and arranged to vary the frequency of the output signal from said second oscillator according to the deviation in frequency of said energy from a given frequency, switching means having first and second conditions, the switching means when in said first condition coupling an input of said comparator circuit to said receiver to compare the carrier frequency of a received signal and the frequency of said signal supplied by said first oscillator, whereby said comparator circuit produces an output signal according to the difference between said carrier frequency and said first oscillator frequency, means responsive to the output signal of said comparator circuit to operate a tuning element in said receiver according to the output signal from said comparator circuit, the switching means when in said second condition coupling the output signal of said second oscillator to said input of said comparator circuit to compare said second oscillator frequency determined by the operation of said control circuit and said first oscillator frequency, said tuning element being operated when said switching means is in said second condition in response to the output signal of said comparator circuit resulting from the comparison of said first and second oscillator frequencies.

9. A system for controlling the tuning of a receiver as claimed in claim 8, said receiver being adapted to receive a radio frequency signal, means including said tuning element in said receiver responsive to said radio frequency signal to produce an intermediate frequency signal, a carrier filter, said switching means when in said first condition coupling said comparator circuit input to the output of said intermediate frequency signal producing means through said carrier filter, and further means in said receiver responsive to said intermediate frequency signal to produce an audio frequency signal, said control circuit being coupled to the output of said audio frequency signal producing means and arranged to vary the frequency of the output signal of said second oscillator according to the deviation in frequency of said audio frequency signal from a given frequency.

References Cited in the file of this patent

UNITED STATES PATENTS

| | | |
|---|---|---|
| 2,354,827 | Peterson | Aug. 1, 1944 |
| 2,611,083 | Arends | Sept. 16, 1952 |
| 2,698,904 | Hugenholtz | Jan. 4, 1955 |
| 2,702,852 | Briggs | Feb. 22, 1955 |
| 2,756,336 | Christensen | July 24, 1956 |